(12) United States Patent
Chang et al.

(10) Patent No.: US 8,138,016 B2
(45) Date of Patent: Mar. 20, 2012

(54) LARGE AREA INTEGRATION OF QUARTZ RESONATORS WITH ELECTRONICS

(75) Inventors: David T. Chang, Calabasas, CA (US); Randall L. Kubena, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 383 days.

(21) Appl. No.: 12/399,680

(22) Filed: Mar. 6, 2009

(65) Prior Publication Data
US 2009/0189294 A1 Jul. 30, 2009

Related U.S. Application Data

(62) Division of application No. 11/502,336, filed on Aug. 9, 2006, now Pat. No. 7,555,824.

(51) Int. Cl.
*H01L 21/44* (2006.01)
*H01L 23/34* (2006.01)

(52) U.S. Cl. ........ 438/107; 438/110; 438/118; 257/723; 257/E21.598

(58) Field of Classification Search .......... 438/107, 438/109, 110; 257/E21.598, 723
See application file for complete search history.

(56) References Cited

U.S. PATENT DOCUMENTS

| | | |
|---|---|---|
| 392,650 A | 11/1888 | Watrous |
| 3,766,616 A | 10/1973 | Staudte .......................... 29/25.35 |
| 4,364,016 A | 12/1982 | Tanski ............................ 333/193 |
| 4,426,769 A | 1/1984 | Grabbe ............................ 29/588 |
| 4,442,574 A | 4/1984 | Wanuga et al. ............... 29/25.35 |
| 4,618,262 A | 10/1986 | Maydan et al. |
| 4,870,313 A | 9/1989 | Hirama et al. ................. 310/320 |
| 4,898,031 A | 2/1990 | Oikawa et al. .................. 73/505 |
| 4,944,836 A | 7/1990 | Beyer et al. .................... 156/645 |
| 5,203,208 A | 4/1993 | Bernstein ......................... 73/505 |
| 5,226,321 A | 7/1993 | Varnham et al. ................ 73/505 |
| 5,260,596 A | 11/1993 | Dunn et al. ..................... 257/414 |
| 5,421,312 A | 6/1995 | Dawson ......................... 123/620 |
| 5,480,747 A | 1/1996 | Vasudev |
| 5,552,016 A | 9/1996 | Ghanayem |
| 5,578,976 A | 11/1996 | Yao et al. ....................... 333/262 |
| 5,589,724 A | 12/1996 | Satoh et al. .................... 310/348 |
| 5,604,312 A | 2/1997 | Lutz ........................... 73/504.14 |
| 5,605,490 A | 2/1997 | Laffey et al. .................... 451/36 |
| 5,644,139 A | 7/1997 | Allen et al. ..................... 250/557 |
| 5,646,346 A | 7/1997 | Okada ........................... 73/504.4 |
| 5,648,849 A | 7/1997 | Canteloup et al. |

(Continued)

FOREIGN PATENT DOCUMENTS

DE 44 42 033 5/1996

(Continued)

OTHER PUBLICATIONS

U.S. Appl. No. 12/026,486, filed Feb. 5, 2008, Kubena.

(Continued)

*Primary Examiner* — Nitin Parekh
(74) *Attorney, Agent, or Firm* — Ladas & Parry

(57) ABSTRACT

Methods for integrating quartz-based resonators with electronics on a large area wafer through direct pick-and-place and flip-chip bonding or wafer-to-wafer bonding using handle wafers are described. The resulting combination of quartz-based resonators and large area electronics wafer solves the problem of the quartz-electronics substrate diameter mismatch and enables the integration of arrays of quartz devices of different frequencies with the same electronics.

18 Claims, 3 Drawing Sheets

U.S. PATENT DOCUMENTS

| | | | |
|---|---|---|---|
| 5,658,418 A | 8/1997 | Coronel et al. | |
| 5,665,915 A | 9/1997 | Kobayashi et al. | 73/514.32 |
| 5,666,706 A | 9/1997 | Tomita et al. | 29/25.35 |
| 5,668,057 A | 9/1997 | Eda et al. | 438/113 |
| 5,728,936 A | 3/1998 | Lutz | 73/504.15 |
| 5,783,749 A | 7/1998 | Lee et al. | 73/504.12 |
| 5,894,090 A | 4/1999 | Tang et al. | 73/504.02 |
| 5,905,202 A | 5/1999 | Kubena et al. | 73/504.15 |
| 5,920,012 A | 7/1999 | Pinson | 73/504.13 |
| 5,928,532 A | 7/1999 | Koshimizu et al. | |
| 5,942,445 A | 8/1999 | Kato et al. | |
| 5,981,392 A | 11/1999 | Oishi | |
| 5,987,985 A | 11/1999 | Okada | 73/504.04 |
| 6,009,751 A | 1/2000 | Ljung | 73/504.02 |
| 6,044,705 A | 4/2000 | Neukermans et al. | 73/504.02 |
| 6,081,334 A | 6/2000 | Grimbergen et al. | |
| 6,094,985 A | 8/2000 | Kapels et al. | 73/504 |
| 6,145,380 A | 11/2000 | MacGugan | 73/493 |
| 6,151,964 A | 11/2000 | Nakajima | 73/488 |
| 6,155,115 A | 12/2000 | Ljung | 73/504.12 |
| 6,164,134 A | 12/2000 | Cargille | 73/504.02 |
| 6,182,352 B1 | 2/2001 | Deschenes et al. | 29/602.1 |
| 6,196,059 B1 | 3/2001 | Kosslinger | 73/61.49 |
| 6,207,008 B1 | 3/2001 | Kijima | |
| 6,250,157 B1 | 6/2001 | Touge | 73/504.12 |
| 6,263,552 B1 | 7/2001 | Takeuchi et al. | 29/25.35 |
| 6,282,958 B1 | 9/2001 | Fell et al. | 73/504.13 |
| 6,289,733 B1 | 9/2001 | Challoner et al. | 73/504.12 |
| 6,297,064 B1 | 10/2001 | Koshimizu | |
| 6,349,597 B1 | 2/2002 | Folkmer et al. | 73/504.08 |
| 6,367,326 B1 | 4/2002 | Okada | 73/504.13 |
| 6,367,786 B1 | 4/2002 | Gutierrez et al. | 267/136 |
| 6,413,682 B1 | 7/2002 | Shibano et al. | |
| 6,417,925 B1 | 7/2002 | Naya | 356/445 |
| 6,424,418 B2 | 7/2002 | Kawabata et al. | 356/445 |
| 6,426,296 B1 | 7/2002 | Okojie | |
| 6,432,824 B2 | 8/2002 | Yanagisawa | |
| 6,481,284 B2 | 11/2002 | Geen et al. | 73/504.02 |
| 6,481,285 B1 | 11/2002 | Shkel et al. | 73/504.13 |
| 6,492,195 B2 * | 12/2002 | Nakanishi et al. | 438/106 |
| 6,513,380 B2 | 2/2003 | Reeds et al. | 73/504.04 |
| 6,514,767 B1 | 2/2003 | Natan | |
| 6,515,278 B2 | 2/2003 | Wine et al. | 250/234 |
| 6,584,845 B1 | 7/2003 | Gutierrez et al. | 73/488 |
| 6,614,529 B1 | 9/2003 | Tang | |
| 6,621,158 B2 | 9/2003 | Martin et al. | 257/704 |
| 6,627,067 B1 | 9/2003 | Branton et al. | |
| 6,628,177 B2 | 9/2003 | Clark et al. | 333/196 |
| 6,629,460 B2 | 10/2003 | Challoner | 73/504.02 |
| 6,651,027 B2 | 11/2003 | McCall et al. | 702/141 |
| 6,715,352 B2 | 4/2004 | Tracy | 73/504.02 |
| 6,756,304 B1 | 6/2004 | Robert | |
| 6,796,179 B2 | 9/2004 | Bae et al. | 73/504.12 |
| 6,806,557 B2 | 10/2004 | Ding | 257/659 |
| 6,815,228 B2 | 11/2004 | Usui et al. | |
| 6,856,217 B1 | 2/2005 | Clark et al. | 333/186 |
| 6,883,374 B2 | 4/2005 | Fell et al. | 73/504.13 |
| 6,933,164 B2 | 8/2005 | Kubena | |
| 6,985,051 B2 | 1/2006 | Nguyen et al. | 333/186 |
| 7,118,657 B2 | 10/2006 | Golovchenko et al. | |
| 7,152,290 B2 | 12/2006 | Junhua | 29/25.35 |
| 7,168,318 B2 | 1/2007 | Challoner et al. | 73/504.13 |
| 7,237,315 B2 * | 7/2007 | Kubena et al. | 29/594 |
| 7,459,099 B2 * | 12/2008 | Kubena et al. | 216/57 |
| 7,543,496 B2 | 6/2009 | Ayazi et al. | 73/504.02 |
| 7,555,824 B2 | 7/2009 | Chang | 29/594 |
| 7,559,130 B2 * | 7/2009 | Kubena et al. | 29/594 |
| 7,581,443 B2 * | 9/2009 | Kubena et al. | 73/504.12 |
| 7,750,535 B2 * | 7/2010 | Kubena et al. | 310/320 |
| 7,884,930 B2 * | 2/2011 | Kirby et al. | 356/301 |
| 2002/0066317 A1 | 6/2002 | Lin | 73/170.33 |
| 2002/0072246 A1 | 6/2002 | Goo et al. | |
| 2002/0074947 A1 | 6/2002 | Tsukamoto | |
| 2002/0107658 A1 | 8/2002 | McCall et al. | 702/141 |
| 2002/0185611 A1 | 12/2002 | Menapace et al. | |
| 2003/0003608 A1 | 1/2003 | Arikado et al. | |
| 2003/0010123 A1 | 1/2003 | Malvern et al. | 73/514.32 |
| 2003/0029238 A1 | 2/2003 | Challoner | 73/504.02 |
| 2004/0055380 A1 | 3/2004 | Shcheglov et al. | 73/504.13 |
| 2004/0065864 A1 | 4/2004 | Vogt et al. | |
| 2004/0189311 A1 | 9/2004 | Glezer | 436/104 |
| 2004/0211052 A1 | 10/2004 | Kubena et al. | 29/594 |
| 2005/0056917 A1 * | 3/2005 | Kwon | 257/678 |
| 2005/0156309 A1 * | 7/2005 | Fujii et al. | 257/702 |
| 2005/0260792 A1 * | 11/2005 | Patel et al. | 438/107 |
| 2006/0016065 A1 | 1/2006 | Nagaura | |
| 2006/0213266 A1 | 9/2006 | French et al. | 73/504.02 |
| 2006/0252906 A1 | 11/2006 | Godschalx et al. | 528/86 |
| 2007/0017287 A1 | 1/2007 | Kubena | 73/504.02 |
| 2007/0205839 A1 | 9/2007 | Kubena et al. | 331/158 |
| 2007/0220971 A1 | 9/2007 | Ayazi et al. | 73/504.02 |
| 2008/0034575 A1 | 2/2008 | Chang et al. | 29/594 |
| 2008/0074661 A1 | 3/2008 | Zhang | |
| 2008/0096313 A1 * | 4/2008 | Patel et al. | 438/107 |
| 2008/0148846 A1 | 6/2008 | Whelan et al. | 73/504.02 |
| 2009/0189294 A1 | 7/2009 | Chang | |

FOREIGN PATENT DOCUMENTS

| | | |
|---|---|---|
| DE | 19719601 | 11/1998 |
| EP | 0 461 761 | 12/1991 |
| EP | 0 531 985 | 3/1993 |
| EP | 1055908 | 11/2000 |
| EP | 0 971 208 | 12/2000 |
| JP | 57-091017 | 6/1982 |
| JP | 401129517 | 5/1989 |
| JP | 04322507 A | 11/1992 |
| JP | 05286142 A | 11/1993 |
| JP | 8330878 | 12/1996 |
| JP | 2005-180921 A | 7/2005 |
| KR | 10-2001-0110428 A | 12/2001 |
| WO | 96/38710 | 12/1996 |
| WO | 98/15799 | 4/1998 |
| WO | 00/68640 | 11/2000 |
| WO | 01/44823 | 6/2001 |
| WO | 01/74708 | 10/2001 |
| WO | 02/12873 | 2/2002 |
| WO | 2005/121769 | 12/2005 |
| WO | 2006/010206 | 2/2006 |
| WO | 2006/103439 | 10/2006 |

OTHER PUBLICATIONS

Properties of SAW resonators fabricated on quartz substrates of various qualities; Greer, J.A.; Parker, T.E.; Montress, G.K.; Ultrasonics Symposium, 1994, Proceedings., 1994 IEEE, vol. 1, Nov. 1-4, 1994; pp. 31-36 vol. 1.

Abe, Takashi, et al., "One-chip multichannel quartz crystal microbalance (QCM) fabricated by Deep RIE," Sensors and Actuators, vol. 82, pp. 139-143 (2000).

Cleland, A.N., et al., "Fabrication of high frequency nanometer scale mechanical resonators from bulk Si crystals," Appl. Phys. Lett., vol. 69, No. 18, pp. 2653-2655 (Oct. 28, 1996).

Evoy, S., et al., "Temperature-dependent internal friction in silicon nanoelectromechanical systems," Applied Physics Letters, vol. 77, No. 15, pp. 2397-2399 (Oct. 9, 2000).

Wright et al., "The HRG Applied to a Satellite Attitude Reference System," Guidance and Control, AAS, 1994, 86: pp. 55-67.

Putty et al., "A Micromachined Vibrating Ring Gyroscope,", Solid State Sensor and Actuator Workshop, Transducer Research Foundation, Hilton Head, 1994, pp. 213-220.

Tang et al., "A Packaged Silicon MEMS Vibratory Gyroscope for Microspacecraft," Proceedings IEEE, 10th Annual Int. Workshop on MEMS, Japan, 1997, pp. 500-505.

Barbour et al., "Micromechanical Silicon Instrument and Systems Development at Draper Laboratory," AIAA Guidance Navigation and Control Conference, 1996, Paper No. 96-3709 (20 pages).

Johnson et al., "Surface Micromachined Angular Rate Sensor," A1995 SAE Conference, Paper No. 950538, pp. 77-83.

Fujita et al., "Disk-shaped bulk micromachined gyroscope with vacuum sealing," Sensors and Actuators A:Physical, vol. 82, May 2000, pp. 198-204.

Skulski et al., "Planar resonator sensor for moisture measurements", Microwaves and Radar, 1998, MIKON '98, 12th International Conf., vol. 3, May 20-22, 1998, pp. 692-695.

Tang et al., "Silicon Bulk Micromachined Vibratory Gyroscope," Jet Propulsion Lab.

Sirbuly, Donald J. et al., Multifunctional Nanowire Evanescent Wave Optical Sensors, Advanced Materials, 2007 (published online: Dec. 5, 2006), 19, pp. 61-66.

White, Lan M., et al., Increasing the Enhancement of SERS with Dielectric Microsphere Resonators, Spectroscopy-Eugene, Apr. 2006.

Yan, Fei, et al., "Surface-enhanced Raman scattering (SERS) detection for chemical and biological agents," IEEE Sensors Journal, vol. 5, No. 4, Aug. 2005.

U.S. Appl. No. 11/818,797, filed Jun. 14, 2007, Kirby.

* cited by examiner

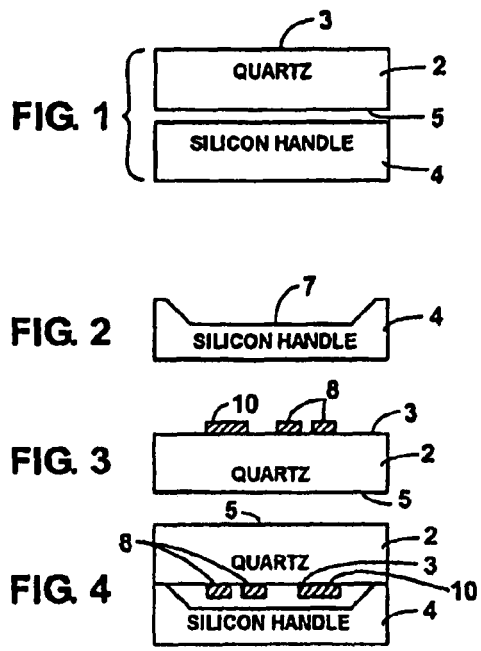
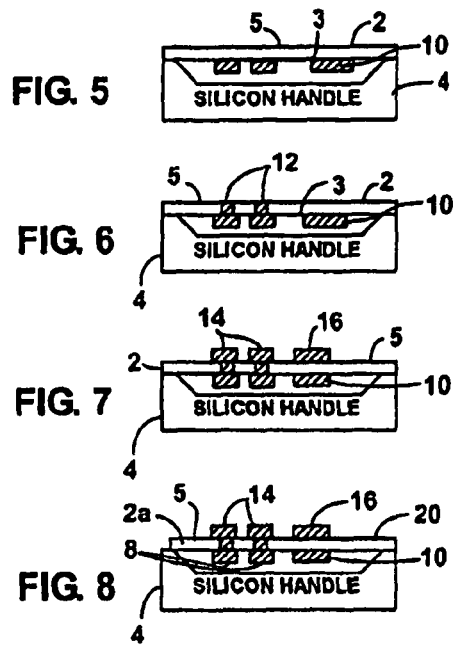
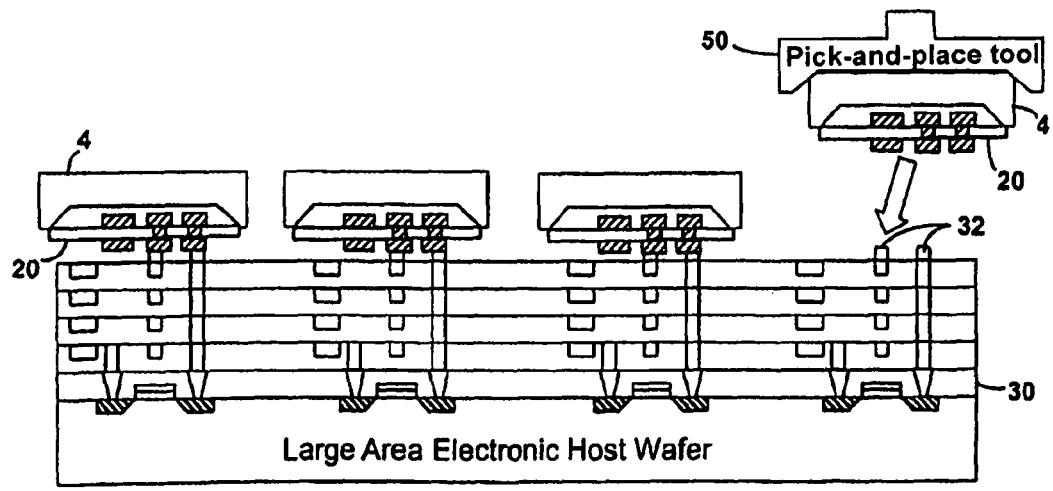

LARGE AREA INTEGRATION OF QUARTZ RESONATORS WITH ELECTRONICS

CROSS-REFERENCE TO RELATED APPLICATION

This application is a division of U.S. patent application Ser. No. 11/502,336, filed on Aug. 9, 2006, now U.S. Pat. No. 7,555,824, the disclosure of which is incorporated herein by reference. This application is also related to U.S. patent application Ser. No. 10/426,931, filed on Apr. 30, 2003, now U.S. Pat. No. 7,237,315; U.S. patent application Ser. No. 11/458,911, filed on Jul. 20, 2006, now U.S. Pat. No. 7,581,443; U.S. patent application Ser. No. 11/502,336, filed on Aug. 9, 2006, now U.S. Pat. No. 7,555,824; U.S. patent application Ser. No. 11/043,378, filed on Jan. 25, 2005, now U.S. Pat. No. 7,459,099; U.S. patent application Ser. No. 11/818,797, filed on Jun. 14, 2007; U.S. patent application Ser. No. 11/800,289, filed on May 4, 2007, now U.S. Pat. No. 7,559,130; U.S. patent application Ser. No. 11/800,294, filed on May 4, 2007, now U.S. Pat. No. 7,750,535; U.S. patent application Ser. No. 12/027,247, filed on Feb. 6, 2008; U.S. patent application Ser. No. 12/145,678, filed on Jun. 25, 2008, now U.S. Pat. No. 7,884,930; and U.S. patent application Ser. No. 12/575,634, filed on Oct. 8, 2009.

STATEMENT REGARDING FEDERALLY SPONSORED RESEARCH OR DEVELOPMENT

Subject matter disclosed in this specification was supported at least in part through governmental grant no. DAAB07-02-C-P613 awarded by the Defense Advanced Research Projects Agency, and is subject to certain governmental rights and interests.

FIELD

The present disclosure relates to nanoresonators and methods for the large-scale integration of nanoresonators with electronics.

BACKGROUND

The use of quartz substrates in a microelectromechanical systems (MEMS) process provides for the fabrication of high quality (Q) factor and thermally compensated resonators. For thickness shear mode resonators, the thickness of the substrate determines the resonant frequency of the resonator. The thinner the quartz substrate, the higher the resonant frequency. Therefore, by varying the thickness of the substrate over a broad range, the resonant frequency can be adjusted over a broad range. Having a quartz substrate with a thickness on the order of 10 microns or less can result in resonant frequencies greater than 100 MHz, which is desirable for high frequency applications.

By combining several quartz based resonators having different resonant frequencies with a radiofrequency (RF) MEMS switch on the same chip, frequency hopping and filter reconfiguration can occur on the microsecond time scale. In frequency hopping and filter reconfiguration the desired frequency in a band of frequencies is selected by using the RF MEMS switch to activate the quartz resonator having a resonant frequency equal to the desired frequency. The spectral band for most radio frequency hopping and filter reconfiguration applications is 20 MHz to 3 GHz. The low frequency part of the band is extremely difficult to cover with conventional capacitive-based filters since capacitive-based filters are larger in size. Frequency hopping and filter reconfiguration applications would benefit from temperature compensated, stable, high-Q (in the amount of about 10,000), arrays of resonators and filters.

However, present quartz fabrication techniques for oscillators or filters do not allow quartz resonators to be integrated on a chip with other electronics. The inability to integrate the quartz resonators on a chip with other electronics is a significant contributing factor to the size and cost of a device due to the need to use separate off-chip components.

MEMS devices which consist of silicon-based nanoresonators have been fabricated in an attempt to integrate nanoresonators or microresonators with other electronics. Nanoresonators and microresonators are resonators which have linear dimensions on the order of nanometers and micrometres or microns, respectively. These silicon-based nanoresonators have shown resonant frequencies as high as 1 GHz, and quality factors in the range of 1000-2000. However, the problem with silicon-based nanoresonators is that they have high electrical impedances and high temperature drift.

An alternative solution is known which makes use of non-MEMS quartz resonators. Such resonators usually consist of shear strip individual resonators operating in ranges of about 10 MHz to about 250 MHz. These resonators are packaged as discrete devices and mounted as hybrids to other RF circuits. The problem with non-MEMS quartz resonators is that they are non-integrable, they have higher costs, lower frequencies, and they are physically larger in size.

U.S. patent application Ser. No. 11/426,931 for "Quartz-Based Nanoresonators and Method of Fabricating Same," published as 2004/0211052 A1, is co-owned with and a parent to the current application. The disclosure of U.S. patent application publication 2004/0211052 is hereby incorporated by reference in this specification for all purposes allowed by law and regulation. This application is addressed to a method for fabricating a quartz nanoresonator that can be integrated on a substrate along with other electronics. It teaches a method for fabricating and integrating quartz-based resonators on a high speed substrate for integrated signal processing that utilizes a combination of novel bonding and etching steps to form ultra thin quartz based resonators. Thinning the quartz substrate in the quartz resonator provided the desired resonant frequency. The quartz resonators made by this process may achieve a frequency in excess of 1 GHz.

The first embodiment of the process for forming quartz nanoresonators disclosed in U.S. patent application publication 2004/0211052 is shown in general outline in the diagrams of FIGS. 1-13 of that patent application publication. Referring now to the drawings of the present specification, FIGS. 1-8 summarize this process. The step shown in FIG. 1 shows the provision of the starting materials, namely, wafers or substrates of single-crystal quartz 2 and silicon 4 (the "silicon handle"). The quartz wafer 2 has a first surface 3 and a second surface 5.

The next step is shown in FIG. 2, which is to define and etch a cavity 7 in the silicon handle wafer 4. A third step, shown in FIG. 3, is to deposit the top-side electrode 10 and the interconnect bond metal 8 metal onto the quartz wafer 2 using known methods of patterning and metalizing. The electrode 10 is a "top-side" electrode because ultimately first surface 3 will be the top surface and the electrode 10 will be on top.

In a fourth step, shown in FIG. 4, the quartz wafer 2 is reversed and then brought together with the silicon handle wafer 4 using a direct bonding process.

A fifth step, shown in FIG. 5, uses lapping and reactive ion etching to thin and polish at least part of the quartz wafer 2 into a to a precisely measured thickness suitable for the desired resonant frequency. It will be appreciated that second surface 5 is now closer to first surface 3 due to the thinning of the quart wafer 2. Next, in a sixth step, shown in FIG. 6, photolithography techniques are used to pattern and metallize via holes 12 in the quartz wafer. In a seventh step, shown in FIG. 7. bottom-side bonding pads 14, and bottom side electrode 16, are deposited.

The contact vias 12 will provide electrical access to the top-side electrodes of the resonator from the bottom-side bonding pads 14 that will be in contact with probe pads on the substrate or host wafer 6 that will support the quartz resonator. The host wafer 6 could contain high-speed RF electronics, thus eliminating the need for lengthy bond wires and facilitating on-chip integration.

In an eighth step, see FIG. 8, the quartz wafer 2 is patterned and etched into a modified quartz substrate 2a, thus forming the final resonator 20. The resonator 20 is still attached to the silicon handle 4.

In a later step shown in U.S. patent application publication 2004/0211052, but not shown in the drawings of this application, the quartz resonator is later transferred and attached to a base substrate of about the same diameter. Since quartz wafers are typically grown in sizes up to four to five inches (10.2 to 12.7 centimeters), bonding a four inch quartz wafer to a twelve inch (30.5 centimeters) CMOS wafer would not utilize all the electronic components on the CMOS wafer. One would prefer to bond a twelve inch quartz wafer to a twelve inch CMOS wafer but twelve inch quartz wafers are not available. FIGS. 10 and 11 of U.S. patent application publication 2004/0211052 show the shaping and addition of probe pads to the base substrate and FIG. 12 of that publication shows the attachment of the quartz resonator to the probe pads on the base substrate. In a still later step (shown in FIG. 13 of U.S. patent application publication 2004/0211052) the silicon handle wafer 4 is removed from the quartz resonators 20.

The purpose of the first and second bonding metals 8 and 14 is to receive an electrical signal from the probe pads which can bias or drive the resonator 20 with an electric field. The electrical signal is preferably an AC signal. When the electrical signal is received by the first and second electrodes 10 and 16 a stress is placed on the modified quartz substrate 2a. This stress stimulates the mechanical resonant frequency of the modified quartz substrate 2a by the piezoelectric effect, thereby causing the modified quartz substrate 2a to oscillate at its resonant frequency. Additionally, it is also possible to use the first and second electrodes 10 and 16 to sense the movement of the modified quartz substrate 2a relative to a specified plane (not shown). Once the modified quartz substrate 2a is oscillating at its resonant frequency, it can be used to drive other electrical components at a frequency equal to its resonant frequency. a 8 and testable. By ablating a portion of the bottom electrode 16, the resonant frequency of the quartz resonator 20 can be adjusted before final integration with the CMOS substrate. This ablation can be performed with known techniques such as focussed ion beam milling or laser ablation. finally, the wafer is diced for final assembly onto the electronic substrate.

U.S. patent application publication 2004/0211052 addressed direct wafer-to-wafer bonding of quartz devices to electronics and was only applicable to electronics wafers with diameters of about four inches or less. Since there is low demand for large quartz wafers, wafers of crystalline quartz larger than about four to five inches in diameter are not available. In addition, the packaging density of the quartz resonators on the final CMOS wafer will not in general provide for optimal useage of the quartz wafer and can result in wasted quartz.

Present quartz fabrication techniques for oscillators or filters do not allow the resonators to be integrated on-chip with associated electronics. Only individual oscillators can be purchased for hybrid integration with RF circuits for wireless applications. U.S. patent application 2004/0211052 describes a process to integrate the quartz devices on electronic substrates, but only for wafers which are four to five inches in diameter. This limits the large volume production on CMOS wafers since most high voltage CMOS fabrication is performed on larger wafers. Only compound semiconductor processing of Group III-V electronics is currently being manufactured with four inch wafers. Precise wafer-to-wafer bonding can only be performed in current aligners with wafers of similar size. In addition, no solutions for integrating quartz devices or pre-testing and screening individual resonators for optimized yield were known.

As a result, a new process for integrating quartz-based resonators with electronics on a large area wafer is desired in order to solve the aforementioned problems.

SUMMARY

The methods disclosed and claimed herein provides for attaching quartz-based devices such as quartz resonators to host electronics wafers of any size. This may be accomplished through direct pick-and-place and flip-chip bonding or handle wafer bonding.

The methods disclosed and claimed herein for integrating quartz-based devices such as quartz resonators to large area electronic wafers have the following advantages:

1. a fabrication process which allows on-chip integration of quartz-based devices, such as quartz resonators, with electronics made on large area substrates (diameter greater than four inches) through direct pick-and-place and flip-chip bonding or handle wafer bonding;

2. the ability to pre-test and select known-good-dies from the quartz-based devices wafer and bin together devices of similar performance; and 3. the ability to integrate quartz-based devices of different characteristics such as frequencies onto the same electronic wafer. This is useful for frequency selection applications.

4. The ability to reduce the cost of fabrication by optimizing the packaging density of the quartz resonators on the quartz substrate while still allowing for arbitrary placement on the CMOS wafer.

The method leads to the integration of quartz-based devices with electronics wafers or substrates of any size. The quartz-based devices may be resonators of any frequency.

In an aspect of the methods disclosed herein, a method for large scale integration of quartz-based devices with an electronic host wafer is provided comprising the steps of: selecting a plurality of quartz-based devices according to their possession of desired characteristics, wherein each selected quartz-based device is attached to an individual handle wafer; attaching the quartz-based devices to the electronics host wafer to form an array of quartz-based devices on the electronics host wafer; bonding the quartz-based devices to the electronics host wafer; and removing the individual handle wafers from the quartz-based devices. The quartz-based devices may be attached serially to the electronics host wafer using pick-and-place and flip-chip techniques. Alternatively, the quartz-based devices may be attached to a group handle. The group handle may be moved so that the quartz-based devices are in position to be attached to the electronics host wafer. The group handle may be removed afterwards.

In another aspect of the methods disclosed herein, a method for large scale integration of quartz-based resonators with an electronics host wafer is provided comprising the steps of: providing a plurality of quartz-based resonators possessing desired resonant frequencies, each of the resonators having at least one electrode formed on a first surface of the quartz-based resonator and being attached to an individual handle wafer; placing the plurality of quartz-based resonators, each attached to an individual handle wafer, in contact with the electronics host wafer to form a predetermined array of quartz-based resonators on a surface of the electronics host wafer wherein the electrode of each quartz-based electrode is in electrical communication with an electrode disposed on the surface of the electronics host wafer; bonding the plurality of quartz resonators to the electronics host wafer; and removing the individual handle wafers from the plurality of quartz-based resonators. The quartz-based resonators may be attached serially to the electronics host wafer using pick-and-place and flip-chip techniques. Alternatively, the quartz-based resonators may be attached to a group handle. The group handle may be moved so that the quartz-based resonators are in position to be attached to the electronics host wafer. The group handle may be removed afterwards.

In an aspect of the devices disclosed herein, a composite of a plurality of quart-based devices bonded to a surface of an electronics host wafer is provided.

In further aspects of the devices disclosed herein, large scale integrations of quartz-based devices with an electronics host wafer formed by the methods disclosed herein are provided.

BRIEF DESCRIPTION OF DRAWINGS

The present invention will be understood and appreciated more fully from the following detailed description taken in conjunction with the drawings in which:

FIG. 1 shows a quartz substrate and a silicon substrate, to be used in accordance with a known process for making a quartz resonator;

FIG. 2 shows the silicon substrate with a cavity used in the known process;

FIG. 3 shows the electrodes and a bond metal formed on the quartz substrate used in the known process;

FIG. 4 shows the quartz substrate bonded to the silicon individual handle wafer in the known process;

FIG. 5 shows the quartz substrate of the known process after it is thinned while being attached to the silicon individual wafer handle;

FIG. 6 shows the patterning and metallizing via holes in the quartz substrate of the known process;

FIG. 7 shows the patterning and metallizing of electrodes and bond metal on the quartz substrate of the known process;

FIG. 8 shows the patterning and etching of the quartz substrate of the known process;

FIG. 9 shows the pick-and-place and flip-chip bonding of quartz-based resonator arrays to a electronic host wafer according to an embodiment of the process of the current invention;

FIG. 12(*b*) shows the temporary silicon group handle wafer fully populated with quartz-based resonators;

DETAILED DESCRIPTION OF PREFERRED EMBODIMENTS

Figure 10:
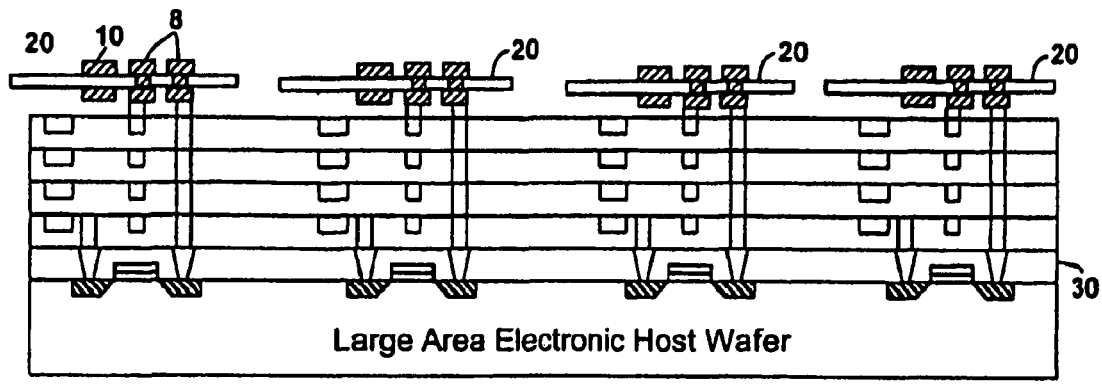
FIG. 10 shows the released quartz-based resonator array on the electronic host wafer after the steps of pick-and-place and flip-chip bonding have taken place as shown in FIG. 9.
Figure 11:
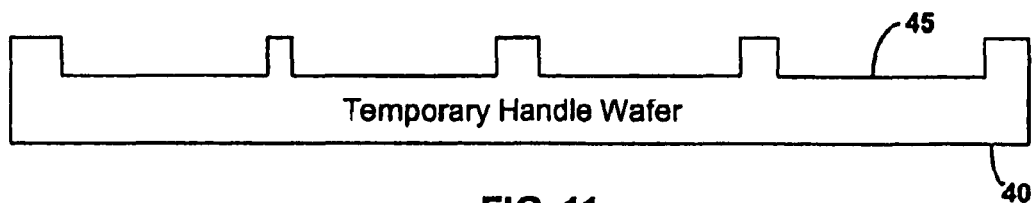
FIG. 11 shows a temporary silicon group handle wafer having receptacles formed using silicon deep reactive ion etching.

The present invention will now be described more fully hereinafter with reference to the accompanying drawings, in which preferred embodiments of the invention are shown. This invention may be embodied in many different forms and should not be construed as limited to the embodiments set forth herein.

In a preliminary step quartz-based devices are formed. In this detailed description of embodiments the quartz-based devices are quartz-based resonators 20 that are formed by methods such as by the methods taught in U.S. patent application publication 2004/0211052 and described above in the background section in connection with FIGS. 1-8. Just as in FIGS. 1-8, the quartz-based resonators 20 have first electrodes 10 and second electrodes 16 connected by metallized vias 12 to the electronic circuit and are provided with first and second bonding metals 8 and 14. At this point, the quartz-based resonators 20 are attached to their silicon handle wafers 4, which will be designated "individual handle wafers 4" to distinguish them from the group handle wafer 40 described below.

In a second step (not shown) the resonators 20 are diced and electrically characterized and tuned while attached to their individual handle wafers 4. Known good dies are sorted and binned according to their resonant frequencies. At this point, the individual quartz-based resonators 20 are ready to be transferred to the large area electronics host wafer 30.

The next or third step is the attachment of the quartz-based resonators 20 to the electronics host wafer.

In a first embodiment of the method disclosed herein, quartz-based resonators of the desired frequencies are precisely placed and bonded to the electronics host wafer 30 serially to form the resonator array as shown in FIG. 9. A flip chip bonder such as Datacon's "2200 apm" multi chip die bonder has a pick and place tool 50 that may be used for this purpose.

In the step shown in FIG. 9, the electronics host wafer 30 is heated to the desired temperature and the metal bond pads 14 of the quartz-based resonators 20 are individually compressed and bonded to electrodes on electronics wafer 30 in the form of the solder bumps 32 using a low temperature thermal compression bond such as Au/In, Au/Sn or Cu/Sn. Alternatively, the die bonder can be used to apply a small amount of conducting epoxy to the metal bond pads or the electronics host wafer and this conducting epoxy forms the electrical contact to the electronics host wafer after curing.

In the first embodiment of the method disclosed herein, once the electronics host wafer 30 is fully populated with the planned number of quartz-based resonators 20, the individual handle wafers 4 can be removed by a process such as a plasma dry etch to release the quartz-based resonators 20, as shown in FIG. 10.

The method disclosed herein has the advantage of being able to build, for example, RF filter arrays with quartz-based resonators 20 of various frequencies that were necessarily fabricated on different wafers. It also enables the assembly of quartz-based resonators 20 of different thickness on the same electronics host wafer 30.

A second embodiment of the method provides variant steps for the assembly of the quartz resonators onto the electronics host wafer 30. A temporary group handle wafer 40, preferably made of silicon, has pre-etched receptacles 45. The receptacles 45 in the group handle wafer may be made using silicon deep reactive ion etching (DRIE).

Figure 12A:
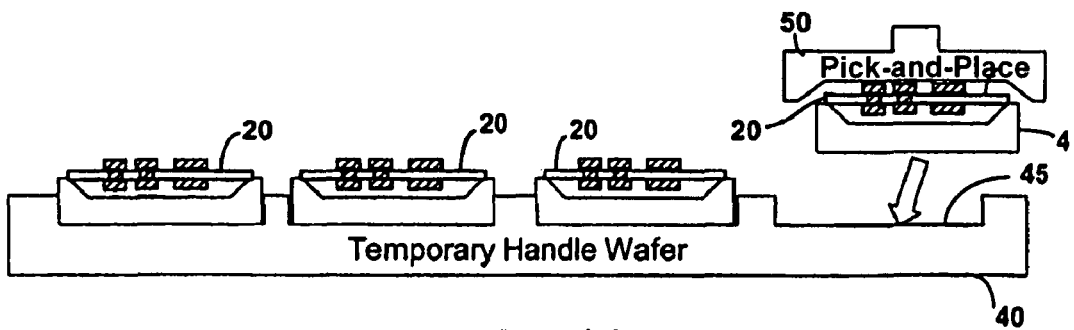
FIG. 12(*a*) shows the population of the temporary silicon group handle wafer with quartz-based resonators using a pick-and-place system.
Figure 12B:
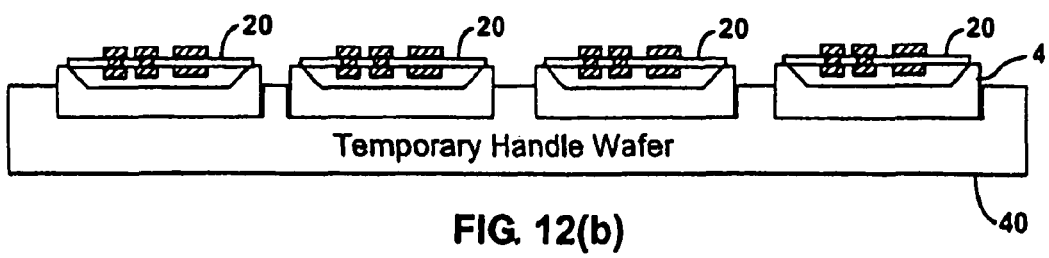

The quartz-based resonators 20 are placed into the pre-etched receptacles 45 of the group handle wafer 40 using the pick-and-place tool 50 as shown in FIGS. 12a and 12b.

Figure 13:
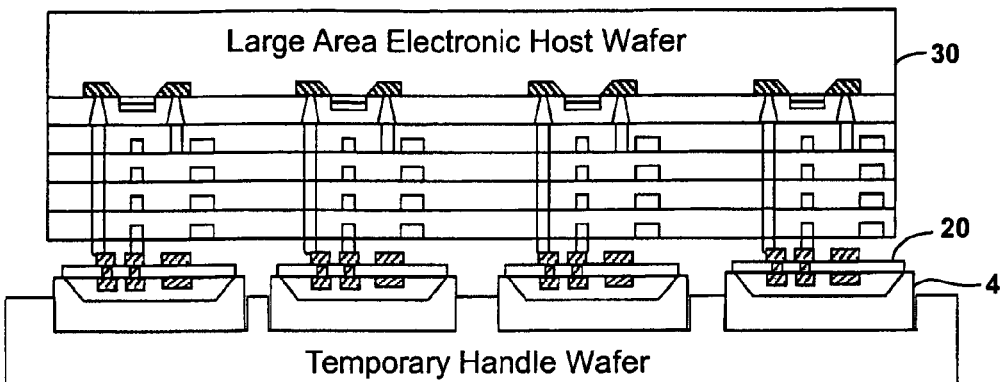
FIG. 13 shows the assembly of the quartz-based resonator array held by the temporary silicon group handle wafer onto the electronic host wafer using wafer-to-wafer bonding.

The group handle wafer 40 with the attached quartz-based resonators 20 is aligned with the electronics host wafer 30. The quartz-based resonators 20 are then bonded to the electronics host wafer 30 using a wafer-to-wafer bond, as shown in FIG. 13. A bonder (not shown), such as EV Group's "EVG520" Semi-Automated Wafer Bonding System, may be employed for this purpose.

Figure 14:
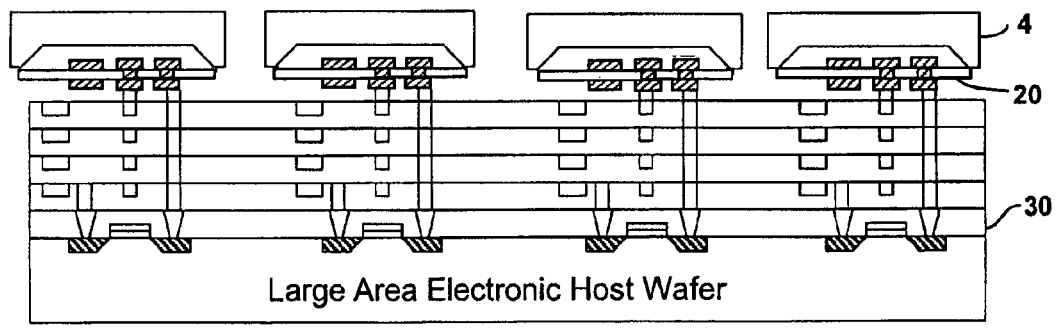
FIG. 14 shows the removal of the temporary silicon group handle wafer from the quartz-based resonators, leaving the quartz-based resonators on the electronic host wafer.

The group handle wafer 40 is then removed, as shown in FIG. 14, by simply lifting off since no strong bond is formed between the individual handle wafers 4 and the group handle wafer 40. The group handle wafer 40 is re-usable while the individual handle wafers 4 in FIG. 2 are consumed during final release.

Figure 15:
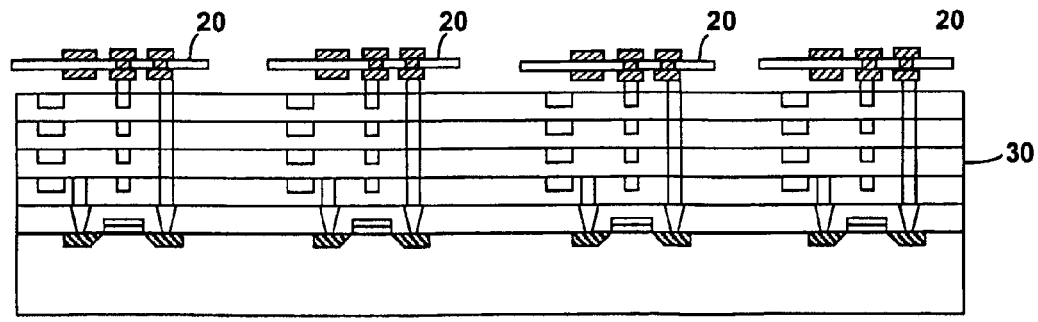
FIG. 15 shows the released quartz-based resonator array on the electronic host wafer.

Finally, the individual handle wafers 4 on the individual quartz-based resonators 20 are removed, preferably by dry plasma etching, leaving only the quartz-based resonators 20 attached to the electronics host wafer 30 as shown in FIG. 15.

The second embodiment has the advantage of bonding all of the quartz-based resonators 20 simultaneously to the electronics host wafer 30, to improve throughput. It also enables the bonding of the quartz-based resonators 20 in a controlled environment (a wafer bonder) when vacuum or backfilling of a process gas is required for the assembly. The disadvantage is that all the quartz-based resonators 20, with individual handle wafers 4 attached, must have the same overall thickness, so using well-known mesa design technology would be necessary to define the thickness of an active part of the quartz-based resonator 20 while allowing the bonding regions to have the same or uniform thickness.

While several illustrative embodiments of the invention have been shown and described in the above description, numerous variations and alternative embodiments will occur to those skilled in the art and it should be understood that, within the scope of the appended claims, the invention may be practised otherwise than as specifically described. Such variations and alternative embodiments are contemplated, and can be made, without departing from the scope of the invention as defined in the appended claims.

The invention claimed is:

1. A large scale integration of quartz-based devices with an electronics host wafer, wherein the large scale integration is formed by a method comprising the steps of:
    selecting a plurality of quartz-based devices according to their possession of desired characteristics, wherein each selected quartz-based device is attached to an individual handle wafer;
    attaching the quartz-based devices to the electronics host wafer to form an array of quartz-based devices on the electronics host wafer;
    bonding the quartz-based devices to the electronics host wafer; and
    removing the individual handle wafers from the quartz-based devices.

2. The large scale integration according to claim 1, wherein the method further comprises the step of dicing and electrically characterizing and tuning the quartz-based devices prior to the step of selecting the plurality of quartz-based devices.

3. The large scale integration according to claim 1, wherein the quartz-based devices are resonators and the step of selecting a plurality of quartz-based devices according to their possession of desired characteristics comprises the step of selecting the resonators according to their resonant frequencies or equivalent circuit parameters.

4. The large scale integration according to claim 1, wherein the step of attaching comprises picking and placing.

5. The large scale integration according to claim 1, wherein the step of attaching comprises placing the quartz-based devices in contact with the electronics host wafer serially to form an array of quartz-based devices on the electronics host wafer.

6. The large scale integration according to claim 1, wherein the step of attaching comprises the steps of attaching each of the plurality of quartz-based devices to a group handle and then moving the group handle in order to contact the quartz-based devices to the electronics host wafer to form a predetermined array of quartz-based devices on the electronics host wafer.

7. The large scale integration according to claim 6, wherein the step of attaching comprises the steps of attaching each of the individual handles of each of the plurality of quartz-based devices to a group handle and then moving the group handle in order to contact the quartz-based devices to the electronics host wafer to form a predetermined array of quartz-based devices on the electronics host wafer.

8. The large scale integration according to claim 7, wherein the method further comprises the step of removing the group handle after the step of bonding the quartz-based devices to the electronics host wafer.

9. The large scale integration according to claim 6, wherein method further comprises the step of removing the group handle after the step of bonding the quartz-based devices to the electronics host wafer.

10. The large scale integration according to claim 1, wherein the steps of attaching and bonding are carried out with a multi-chip die bonder.

11. The large scale integration according to claim 1, wherein the step of bonding comprises applying a conductive epoxy to the bonding sites and curing.

12. The large scale integration according to claim 1, wherein the step of bonding comprises heating the electronic host wafer to a preselected temperature.

13. The large scale integration according to claim 1, wherein the step of bonding further comprises individually compressing the quartz-based devices to the electronics host wafer.

14. The large scale integration according to claim 1, wherein the quartz-based devices each have a surface with at least one electrode and the step of bonding comprises causing a low temperature compression bond between the electrode and an electrode on the electronics host wafer.

15. The large scale integration according to claim 14, wherein the low temperature compression bond is chosen from the group consisting of Au/In, Au/Sn, and Cu/Sn bonds.

16. A large scale integration of quartz-based resonators with an electronics host wafer, wherein the large scale integration is formed by a method comprising the steps of:

providing a plurality of quartz-based resonators possessing desired resonant frequencies, each of the resonators having at least one electrode formed on a first surface of the quartz-based resonator and being attached to an individual handle wafer;

placing the plurality of quartz-based resonators in contact with the electronics host wafer to form an array of quartz-based resonators on a surface of the electronics host wafer wherein the electrode of each quartz-based resonator is in electrical communication with an electrode disposed on the surface of the electronics host wafer;

bonding the plurality of quartz-based resonators to the electronics host wafer; and removing the individual handle wafers from the plurality of quartz-based resonators.

17. The large scale integration according to claim 16, wherein the step of placing is done serially with a pick and place device.

18. The large scale integration according to claim 16, wherein the method further comprises the following steps prior to placing the plurality of quartz-based resonators, each attached to an individual handle wafer, in contact with the electronics host wafer:

providing a group handle with pre-arranged depressions for receiving the plurality of quartz-based resonators; and placing the plurality of quartz-based resonators into the depressions on the group handle.

* * * * *